US010782361B2

(12) United States Patent
Taylor et al.

(10) Patent No.: US 10,782,361 B2
(45) Date of Patent: Sep. 22, 2020

(54) CIRCUIT FOR MONITORING A SOCKET

(71) Applicant: Cirrus Logic International Semiconductor Ltd., Edinburgh (GB)

(72) Inventors: Jonathan Taylor, London (GB); Robert Rand, Peebles (GB); Charles Keepax, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 96 days.

(21) Appl. No.: 15/906,354

(22) Filed: Feb. 27, 2018

(65) Prior Publication Data

US 2018/0246158 A1 Aug. 30, 2018

Related U.S. Application Data

(60) Provisional application No. 62/464,534, filed on Feb. 28, 2017.

(30) Foreign Application Priority Data

Apr. 13, 2017 (GB) .................................. 1706013.8

(51) Int. Cl.
*G01R 31/04* (2006.01)
*G01R 31/69* (2020.01)
(Continued)

(52) U.S. Cl.
CPC ......... *G01R 31/69* (2020.01); *H01R 13/6683* (2013.01); *H04R 5/04* (2013.01); *H01R 24/58* (2013.01); *H01R 2107/00* (2013.01)

(58) Field of Classification Search
CPC ... H04R 1/1041; H04R 29/00; H01R 2105/00
See application file for complete search history.

(56) References Cited

U.S. PATENT DOCUMENTS

2008/0305676 A1 12/2008 Fiennes
2013/0145053 A1 6/2013 Cha et al.
(Continued)

OTHER PUBLICATIONS

Combined Search and Examination Report of the UKIPO, Application No. GB1706013.8, dated Jun. 9, 2017.
(Continued)

*Primary Examiner* — Son T Le
*Assistant Examiner* — Adam S Clarke
(74) *Attorney, Agent, or Firm* — Jackson Walker L.L.P.

(57) ABSTRACT

Circuits for monitoring a socket are disclosed, including a circuit comprising a first node arranged to be electrically connected to a first pole of an electrical plug when the electrical plug is inserted into a corresponding socket, a second node arranged to be connected to a first voltage, wherein the first node is arranged to be connected to the first pole when the electrical plug is inserted into the socket, a variable resistance connected between the first node and a third node, wherein the third node is arranged to receive a second voltage, detection circuit arranged to detect the presence of the electrical plug or moisture in the socket based on a voltage at the first node, and a control circuit arranged to control the variable resistance to a first resistance value and, in response to the detection circuit detecting the presence of the electrical plug or moisture in the socket when the variable resistance is at the first resistance value, to a second resistance value, whereby the detection circuit distinguishes between the electrical plug and moisture within the socket.

19 Claims, 6 Drawing Sheets

(51) Int. Cl.
    *H01R 13/66*     (2006.01)
    *H04R 5/04*     (2006.01)
    *H01R 107/00*     (2006.01)
    *H01R 24/58*     (2011.01)

(56) References Cited

U.S. PATENT DOCUMENTS

| | | |
|---|---|---|
| 2015/0326970 A1 | 11/2015 | Miske et al. |
| 2016/0157033 A1 | 6/2016 | Won et al. |
| 2017/0272877 A1 | 9/2017 | Roh et al. |
| 2018/0146276 A1* | 5/2018 | Azin .................... H04R 1/1041 |
| 2019/0128949 A1* | 5/2019 | Bowlerwell ........... H04R 29/00 |
| 2019/0372334 A1* | 12/2019 | Jung ....................... G06F 13/24 |

OTHER PUBLICATIONS

International Search Report and Written Opinion of the International Searching Authority, International Application No. PCT/GB2018/050504, dated May 11, 2018.

\* cited by examiner

CIRCUIT FOR MONITORING A SOCKET

TECHNICAL FIELD

Embodiments disclosed herein relate to detecting an electrical plug in a corresponding socket, and to detecting moisture within the socket.

BACKGROUND INFORMATION

Many contemporary electronic devices have the facility to connect with peripheral audio devices. For instance, mobile telephones, tablets, laptop computers and the like are examples of electronic devices that are operable with peripheral audio devices such as a headset, for example, that is external to and distinct from the electronic device. Headsets typically comprise mono or stereo speakers for audio playback and a microphone for voice communication.

Such external peripheral audio devices are often connected via a mating connector such as a plug and socket arrangement. For instance, many headsets have a 3.5 mm jack plug for connection to a suitable jack socket on the host electronic device. A well-known arrangement for a jack plug and its associated socket is TRRS (Tip-Ring-Ring-Sleeve), which has four contacts for left audio, right audio, microphone, and ground. In one known arrangement, the tip (T) and first ring (R1) are used for left (L) and right (R) audio, for example left and right loudspeakers, with the second ring (R2) and sleeve (S) used for the ground (G) and microphone (M) respectively. It will be appreciated that different arrangements for the left and right audio, ground and microphone contacts are also possible.

In use, a microphone bias is supplied by the host device to the microphone (M) contact of the socket so that when a plug (which is connected to a headset with an external microphone) is plugged into the compatible socket the external microphone is suitably biased and is ready for use.

Using the well-known arrangement described above as an example for illustrating the problem, as the plug is inserted into or removed from the socket some of the contacts (T, R1, R2, S) on the plug will be moved past and make contact with other various and different contacts (T, R1, R2, S) of the socket. This can lead to undesired effects if there is still a voltage present on a socket contact. For example, when the plug is inserted into or removed from the socket the tip contact T and first ring contact R1 of the plug, which are connected to the speakers (L, R) of a headset, will make contact with the socket R2 contact used to provide bias for the external microphone. If there is a bias voltage present at this socket contact R2 then this may cause the speakers to operate in an undesirable fashion, e.g. to output an audible artefact such as a pop or click sound.

In view of the above, it is desirable to be able to detect insertion or removal of a plug in a socket so that steps can be taken to reduce or eliminate the occurrence of audible artefacts during insertion or removal of the plug. For example, the microphone bias can be disconnected from the socket R2 contact before insertion of the plug, and when removal or partial removal of the plug is detected, so that as other plug contacts such as the tip (T) and first ring (R1) contacts slide past and contact the socket R2 contact, the bias voltage is not applied to the speakers (L, R) of a headset. It is additionally or alternatively desirable to detect insertion or removal of the plug so that other actions may be taken. For example, a host device may provide audio output to the speakers of the headset when the plug is inserted into the socket, and may automatically switch audio output to a speaker within the host device as the plug is removed.

A problem can arise when there is moisture within the socket. If no plug is inserted into the socket, but moisture is present, an electrical connection between socket contacts may form. This may cause a device to incorrectly conclude that a plug has been inserted into a socket. For example, a plug detection circuit may comprise a weak pull up resistor (for example, a 1 Mohm resistor) between a power supply voltage (such as Vdd) and a first socket connector that is arranged to contact a first pole of the plug (such as the tip or R2 connector of the plug) when the plug is inserted into the socket. Thus, when no plug is present, the voltage at the first socket connector is approximately Vdd. When a plug is inserted into the socket, the pole forms an electrical connection between the first socket connector and a second socket connector that contacts the same pole and is connected to ground. As a result, the voltage at the first socket connector is pulled to approximately ground. This may cause the circuit to conclude that a plug is present. However, moisture in the socket in the absence of a plug may cause a sufficient electrical connection between the socket connectors and cause the voltage at the first socket connectors to be pulled close enough to ground to be interpreted as a plug being inserted, even though no plug is present.

Some circuits may perform an impedance measurement if the first socket connector has been pulled close to ground. For example, the impedance between the first and second socket contacts that are arranged to contact the same pole of an inserted plug is measured. If the impedance is above a certain value then it is assumed that moisture has entered the socket instead of a plug.

If moisture is detected in the socket in this manner, then it is no longer possible to detect a plug insertion using the voltage at the first socket connector alone because the moisture has already pulled the voltage at this connector to approximately ground. As the impedance measurement is a relatively lengthy procedure (taking for example 64 ms in some cases) that consumes a relatively significant amount of current, it is only performed once when the voltage at the first socket connector is pulled to approximately ground. Therefore, the device may render the socket unusable until the moisture has evaporated. This is inconvenient if the user of the device wishes to use a headset, and may also prevent the device from detecting insertion or removal of a plug, hence rendering the automatic switching between a speaker and a headset inoperable.

Summary of Embodiments

According to a first aspect, there is provided a circuit comprising a first node arranged to be electrically connected to a first pole of an electrical plug when the electrical plug is inserted into a corresponding socket; a second node arranged to be connected to a first voltage, wherein the first node is arranged to be connected to the first pole when the electrical plug is inserted into the socket; a variable resistance connected between the first node and a third node, wherein the third node is arranged to receive a second voltage; detection circuit arranged to detect the presence of the electrical plug or moisture in the socket based on a voltage at the first node; and a control circuit arranged to control the variable resistance to a first resistance value and, in response to the detection circuit detecting the presence of the electrical plug or moisture in the socket when the variable resistance is at the first resistance value, to a second resistance value, whereby the detection circuit distinguishes between the electrical plug and moisture within the socket.

In some embodiments, the first voltage is a first power supply voltage, and the second voltage is a second power supply voltage.

In some embodiments, the detection circuit is arranged to detect whether the voltage at the first node is at a level between the first voltage and a first reference voltage. The detection circuit may in some examples comprise a comparator arranged to compare the voltage at the first node with the first reference voltage. In some embodiments, the comparator is arranged to output a first value indicating that the voltage at the first node is between the first voltage and the first reference voltage, and a second value indicating that the voltage at the first node is between the second voltage and the first reference voltage. The first reference voltage level may in some cases be between the first and second voltages.

In certain embodiments, the variable resistance comprises a first resistor connected between the first node and the third node, and a second resistor and a switch connected in series between the first node and the third node, wherein the second resistor is one of a fixed resistor and a variable resistor.

In some embodiments, in the variable resistance comprises a first resistor connected between the first node and the third node, and a second resistor connected between the first node and the third node, wherein the second resistor is a variable resistor.

The variable resistance may in some embodiments comprise a first resistor and a second resistor connected in series between the first node and the third node, and a switch connected in parallel with the first resistor or the second resistor.

In some embodiments, the control circuit is arranged, in response to the detection circuit detecting the presence of the electrical plug or moisture in the socket, to periodically control the variable resistance to the second resistance value.

The control circuit in some embodiments is arranged, when the detection circuit detects the presence of the electrical plug in the socket but does not detect the presence of moisture in the socket, to control the variable resistance to the first resistance value.

The first resistance value may in some embodiments be greater than the second resistance value. For example, the resistance value may 1 Mohm and the second resistance value may be a value between 2 kohm and 10 kohm, or may be variable between these values. In certain embodiments, the first resistance value is at least 100× the second resistance value.

In some embodiments, the control circuit is arranged to generate a first output signal on detection of the electrical plug or moisture in the socket by the detection circuit, and a second output signal on detection of the electrical plug but not moisture in the socket. The first and second signals may in some embodiments be interrupt signals.

In some embodiments, the first pole is a second ring (R2) connector of a 2.5 mm jack plug.

In some embodiments, the circuit is an integrated circuit (IC).

According to a second aspect, there is provided a device comprising a socket for an electrical plug and a circuit according to the first aspect, wherein the socket comprises a first connector connected to the first node and a second connector connected to the second node and the first voltage.

The device in some examples may be one of a laptop computer, desktop computer, tablet computer and mobile telephone.

According to a third aspect, there is provided a method comprising controlling a variable resistance connected between a second voltage and a first node to a first resistance value; detecting the presence of an electrical plug inserted into a corresponding socket or moisture in the socket based on a voltage at the first node, whereby when the electrical plug is inserted into the socket, the first node is arranged to be connected to a first pole of the electrical plug and the first pole is arranged to be connected to a first voltage; in response to detecting the presence of an electrical plug inserted into a corresponding socket or moisture in the socket: controlling the variable resistance to a second resistance value; and distinguishing between the electrical plug and moisture within the socket based on the voltage at the first node.

In some embodiments, the method further comprises detecting based on the voltage at the first node comprises detecting whether the voltage at the first node is between the first power supply voltage and a first reference voltage. The reference voltage may in some example embodiments be between the first and second power supply voltages.

In some embodiments, the method further comprises, in response to a detection circuit detecting the presence of the electrical plug or moisture in the socket, periodically controlling the variable resistance to the second resistance value.

In some embodiments, the method further comprises, in response to detecting the presence of the electrical plug in the socket but not moisture in the socket, controlling the variable resistance to the first resistance value.

Controlling the variable resistance to the second resistance value may in certain embodiments comprise controlling the variable resistance to a resistance lower than the first resistance value.

In some embodiments, wherein the first resistance value is at least 100× the second resistance value.

In some embodiments, the method further comprises generating a first output signal on detection of the electrical plug or moisture in the socket, and generating a second output signal on detection of the electrical plug but not moisture in the socket.

According to a fourth aspect, there is provided a circuit comprising a first connector arranged to contact a first pole of an electrical plug when the electrical plug is inserted into a corresponding socket, wherein the first connector is connected to a first power supply voltage; a second connector connected to a first node and arranged to contact the first pole of the electrical plug when the electrical plug is inserted into the socket; a variable resistance connected between the first node and a second power supply voltage; a detection circuit arranged to detect the presence of the electrical plug or moisture in the socket based on a voltage at the first node; and a control circuit arranged to control the variable resistance to a first resistance value and, in response to the detection circuit detecting the presence of the electrical plug or moisture in the socket, to a second resistance value, whereby the detection circuit detects the presence of the electrical plug in the socket but does not detect the presence of moisture in the socket.

The circuit of the fourth aspect may comprise in some embodiments a variable resistance between a first node and a first voltage, the circuit arranged to control the variable resistance between at least two values to distinguish between the plug and moisture in the socket.

In some embodiments, the first node is arranged to be electrically connected to a second voltage when the plug is inserted into the socket.

According to a fifth aspect, there is provided an integrated circuit comprising a first node arranged to be electrically connected to a first pole of an electrical plug when the electrical plug is inserted into a corresponding socket; a second node arranged to be connected to a first voltage, wherein the first node is arranged to be connected to the first pole when the electrical plug is inserted into the socket; a variable resistance connected between the first node and a third node, wherein the third node is arranged to receive a second voltage; detection circuit arranged to detect the presence of the electrical plug or moisture in the socket based on a voltage at the first node; and a control circuit arranged to control the variable resistance to a first resistance value and, in response to the detection circuit detecting the presence of the electrical plug or moisture in the socket when the variable resistance is at the first resistance value, to a second resistance value, whereby the detection circuit distinguishes between the electrical plug and moisture within the socket. A chip package that contains the integrated circuit of the fifth aspect may also be provided.

BRIEF DESCRIPTION OF THE DRAWINGS

Specific embodiments will now be described by way of example only with reference to the accompanying Figures, in which.

DETAILED DESCRIPTION OF EMBODIMENTS

Some embodiments disclosed herein may provide a circuit that can distinguish between a plug and moisture within a socket. For example, the circuit may detect the presence of either a plug or moisture in the socket, when a variable resistance is at a first resistance value, the variable resistance being connected between a first node and a supply voltage such as Vdd, and the first node being arranged to contact a first pole of the plug when the plug is inserted into the socket, for example via a socket connector arranged to contact the first pole.

When a detection circuit detects the presence of a plug or moisture, for example based on voltage at the first node, the variable resistance is then controlled to a second resistance value. As a result, the detection circuit detects the presence of a plug in the socket, but does not detect the presence of moisture. That is, for example, the detection circuit may output a positive detection result if a plug has been inserted, but does not output a positive detection result if there is moisture but no plug in the socket. If no plug is detected at this stage, then the circuit may assume that the first detection (when the variable resistance was at the first resistance value) detected the presence of moisture. Therefore, the circuit can reliably distinguish between a plug and moisture within the socket. Some embodiments may also reduce or eliminate problems of audible artefacts when a plug associated with a headset is inserted into the socket, and/or oxidation of contacts within the socket. The circuit may also distinguish between a plug and moisture in the socket without performing a lengthy impedance measurement that consumes significant current.

Figure 1:
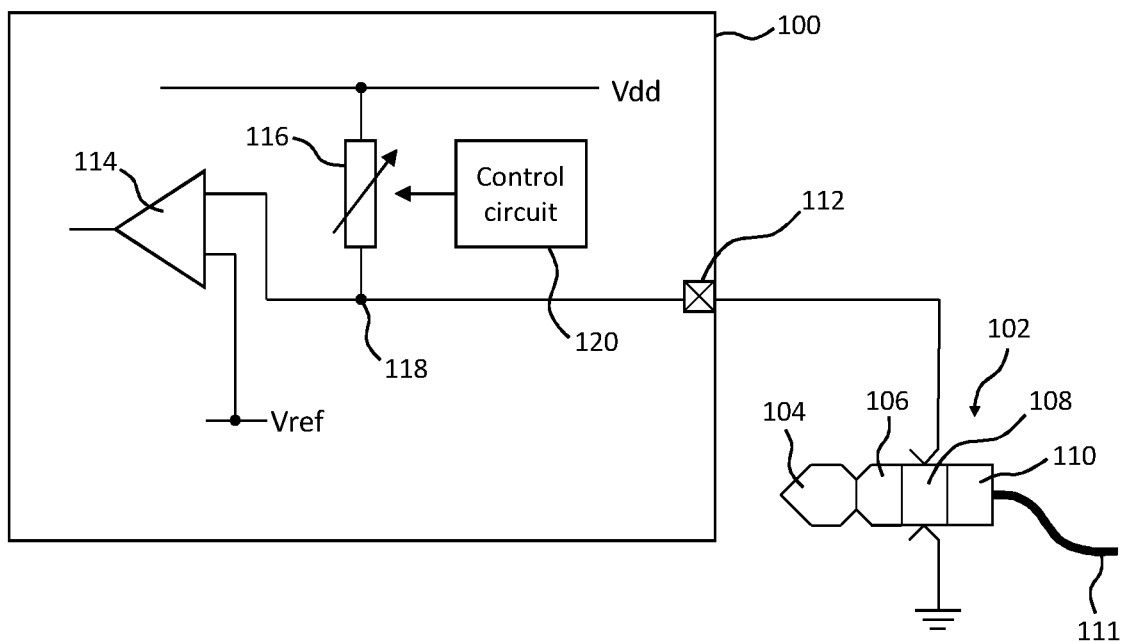
FIG. 1 illustrates an embodiment of a circuit that may be used to distinguish between a plug and moisture within a socket.

FIG. 1 illustrates an embodiment 100 of a circuit for detecting the presence of an electrical plug or moisture in a socket. In some embodiments, the circuit 100 is an integrated circuit. A plug 102 is shown inserted into the socket, the socket not being shown for clarity. The plug 102 shown in this example is a four-pole TRRS plug with a tip connector 104, first ring connector 106, second ring connector 108 and sleeve connector 110. The plug 102 also includes a cable 111 for connection to apparatus associated with the plug 12, such as for example a headphone, headset and the like.

The socket includes a first connector connected to a reference voltage, in this embodiment ground, and a second socket connector connected to a pad 112. The first and second connectors are connected to the same pole of the plug 102 when the plug is fully inserted in the socket. In the example shown in FIG. 1, this pole is the R2 connector 108 of a TRRS plug, typically associated with a headset that includes left and right headphone speakers and a microphone. If a TRS plug is fully inserted (typically associated with headphones including left and right speakers but no microphone), the connectors contact the sleeve of the plug. However, connection to other poles of the inserted plug is possible in other embodiments. Additionally or alternatively, other types of plug may be used.

The circuit 100 includes a detection circuit 114, which in this example embodiment is a comparator. The comparator 114 receives the voltage at terminal 112 and a reference voltage Vref as inputs. The circuit 100 also includes a variable resistance 116 connected between a power supply voltage Vdd and a first node 118. The node 118 is connected to the node 112. The resistance of the variable resistance 116 can be controlled by a control circuit 120.

Figure 2:
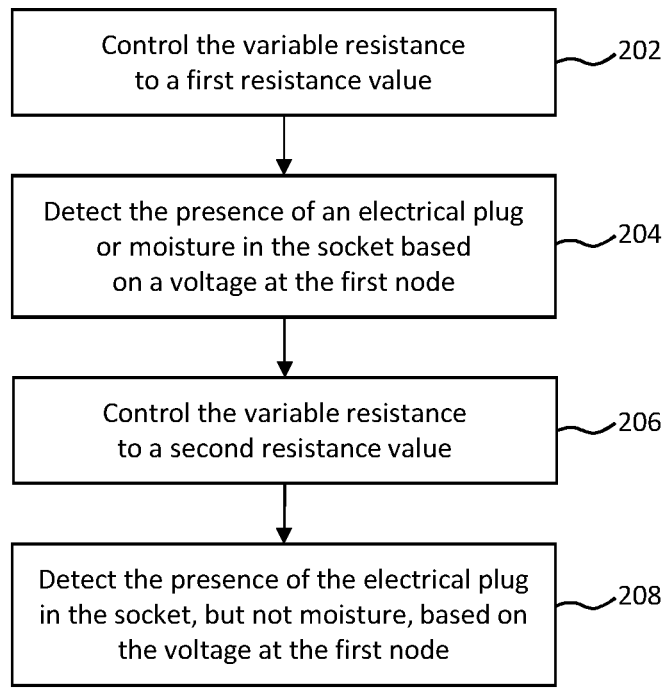
FIG. 2 illustrates a flow chart of an example operation of the circuit of FIG. 1.

FIG. 2 illustrates a flow chart of a method 200 of steps taken by certain embodiments, such as the circuit 100 of FIG. 1, to detect the presence of an electrical plug or moisture in a socket, or to distinguish between a plug and moisture in the socket. The method 200 begins at step 202, where the control circuit 120 controls the variable resistance 116 to a first resistance value. For example, the first resistance value may be 1 Mohm. The first resistance value may be chosen to provide a relatively weak pull up of the pad 112 to the supply voltage Vdd, so that when a plug is inserted into the socket that is connected to headphones or a headset, and the tip or R1 poles contact the R2 contact of the socket, it is unlikely that audible artefacts will occur from associated speakers.

Next, in step 204, the detection circuit 114 detects the presence of a plug or moisture in the socket. If either of these is present in the socket, in the example of FIG. 1, the node 118, connected to the pad 112 and the detection circuit 114, is pulled to ground or near ground. The detection circuit 114, which compares the voltage at the node 118, i.e. terminal 112, to the reference voltage Vref, will switch its output as the voltage drops below Vref, i.e. provide a positive detection result, and hence indicate that a plug or moisture has entered the socket. At this point, it is not known whether it is the plug or moisture that has been detected. The actual value output by the comparator to indicate a positive detection result can be any value and may depend on implementation. For example, the comparator may output a voltage that is a logic level '1' to indicate a positive detection result, and a voltage at a logic level '0' to indicate a negative detection result. Alternatively, the comparator may output a voltage that is a logic level '1' to indicate a negative detection result, and a voltage at a logic level '0' to indicate a positive detection result. Any suitable voltage level may be used by the detection circuit 114 to indicate a positive or negative detection result.

In the next step 206 of the method 200, the control circuit 120 controls the variable resistance 116 to a second resistance value. This can be done in response to the detection circuit 114 detecting the presence of the plug 102 or moisture in the socket. The second resistance value can be chosen so that the detection circuit 114 subsequently detects the presence of the plug in the socket, but does not detect the presence of moisture in the socket. For example, in some embodiments, the second resistance value can be chosen to provide a relatively strong pull up of the node 118 to the power supply voltage Vdd. As such, the second resistance value may be less than the first resistance value. In some embodiments, the first resistance value may be at least 100 times greater than the second resistance value. As an example, the first resistance value may be 1 Mohm, and the second resistance value may be between 2 kohm and 10 kohm, for example 5 kohm.

Due to the variable resistance 116 being controlled such that it has a second resistance value, the presence of the plug 102 in the socket will still pull the pad 112 and the node 118 to ground, due to the very low resistance of the plug poles. As such, the output of the detection circuit 114 will indicate that there is a plug present in the socket, i.e. provide a positive detection result. For example, as the detection circuit 114 had already been providing an output that indicates the presence of the plug or moisture in step 204, the output of the detection circuit 114 will not change. On the other hand, if there is no plug present but there is moisture present instead, this will not provide a low enough resistance to bring the voltage at the pad 112 and node 118 below Vref. As a result, the detection circuit 114 will indicate that a plug has not been detected in the socket, and it could be assumed that moisture is present instead. For example, the output of the detection circuit 114 may change when the variable resistance is changed from the first resistance value to the second resistance value.

Thus, in step 208 of the method 200, the presence of the plug, but not moisture, in the socket is detected by the detection circuit 114.

The output of the detection circuit 114 may be used at steps 204 and 208 to determine whether a plug or moisture has been detected in the socket. Based on this determination, in some example embodiments, action may be taken. Examples of such action may include, but are not limited to, one or more of an audible sound being played from a speaker, headset or headphone, a message on a screen, or any other action, including making a decision to take no further action. The action may be taken by other components (not shown) of the circuit 100, or other circuits of a device (not shown) that includes the circuit 100.

Table 1 below indicates the output of the detection circuit 114 in one example embodiment at steps 206 and 208 with nothing in the socket, a plug in the socket, and moisture in the socket, with a '1' indicating a positive detection result and a '0' indicating a negative detection result. The first output occurs at step 204, and the second output occurs at step 208. It is noted that if there is neither a plug nor moisture in the socket, step 208 may not be performed in some embodiments and thus no second output is generated.

TABLE 1

| Within socket | First output | Second output |
|---|---|---|
| Nothing | 0 | n/a |
| Moisture | 1 | 0 |
| Plug | 1 | 1 |
| Moisture and plug | 1 | 1 |

It can be seen from Table 1 that the presence of moisture or a plug in the socket can be distinguished using the first output and the second output. In some embodiments, these outputs may be used to generate interrupt signals to inform other components (not shown) of the presence of a plug and/or moisture within the socket.

Once step 208 has been carried out, in some embodiments, the control circuit 120 may return the variable resistance 116 to the first resistance value, such as 1 Mohm, to ensure that when the plug (if present) is subsequently removed from the socket, there is a reduced likelihood of audible artefacts than if the variable resistance is maintained at the second resistance value, such as 5 kohm. Additionally or alternatively, the possibility of oxidation within the socket may be reduced.

Other embodiments may further periodically repeat at least some of steps 202-208. For example, there may be at least some intervals where the supply voltage Vdd is not applied to node 112 via the variable resistance 116. In other words the voltage pull-up provided by supply voltage Vdd and variable resistance 116 may be pulsed on and off. In some embodiments, if a plug or moisture is detected in step 204, then the detection circuit may periodically (such as every 8 ms in some embodiments) control the variable resistance 116 to the second resistance value to "test" the socket to determine if a plug (but not moisture) is present. Between the periodic "tests" using the second resistance value there may be at least some periods where the detection circuit returns the variable resistance to the first resistance value and/or there may be some periods where the supply voltage Vdd is not applied to node 112 via the variable resistance 116. In this way, both insertion and removal of a plug may be detected, even in the presence of moisture, without continually maintaining the variable resistance 116 at the second resistance value and/or without a constant current being applied.

Figure 3:
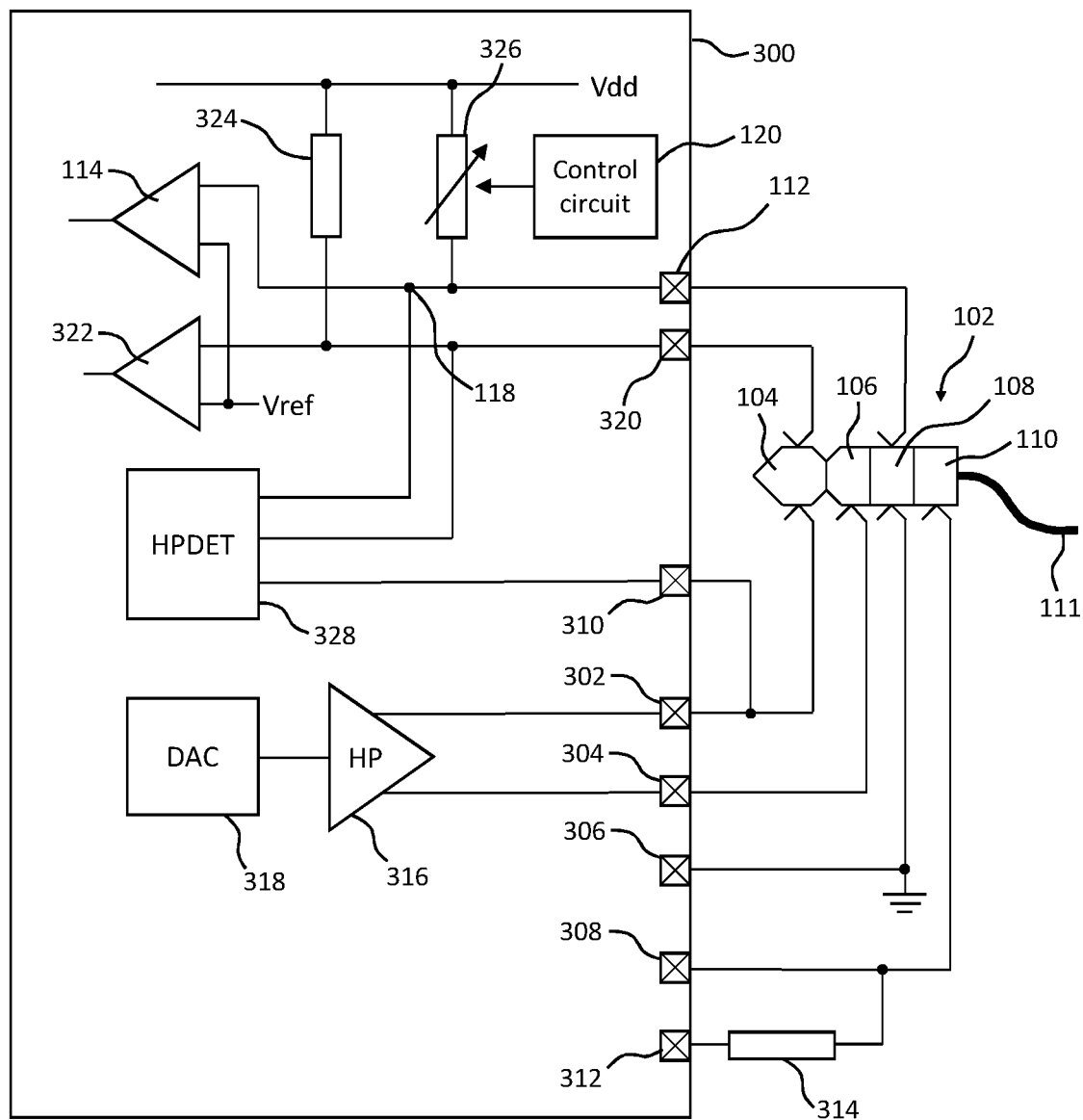
FIG. 3 illustrates another embodiment of a circuit that may be used to distinguish between a plug and moisture within a socket.

FIG. 3 shows a further embodiment of a circuit 300 for detecting the presence of an electrical plug or moisture in a socket. A plug 102 is shown inserted into the socket, which is not shown for clarity. Features that are similar to those shown in FIG. 1 are given the same reference numerals.

The socket includes connectors for contacting the tip 104, first ring (R2) 106, second ring (R3) 108 and sleeve 110 of a fully inserted plug 102. These connectors connect to pads, terminals or nodes 302, 304, 306 and 308 respectively. The tip connector is also connected to pad 310. The sleeve connector is also connected to pad 312 via resistor 314. Therefore, the pads 302 and 304 may provide left and right audio respectively from audio amplifier 316 which receives audio from a digital to analogue converter (DAC) 318. Pad 306 may be connected to ground (or some other defined voltage) and the pad 312 may provide a microphone bias voltage via resistor 314.

The socket also includes additional tip and R2 connectors connected to pads 320 and 112 respectively. The pads 320 and 112 are connected to a first input of comparators 322 and 114 respectively. The second inputs of the comparators 322 and 114 receive a reference voltage Vref.

A resistor 324 is connected between power supply voltage Vdd and pad 320. A variable resistance 326 is connected between the power supply voltage Vdd and a node 118, which is connected to the pad 112. The variable resistance 326 is controlled by control circuit 120. The variable resistance 326 may be controlled, by control circuit 120, to vary between at least first and second resistance values in the same way as discussed above so that the presence of plug can be detected and discriminated from moisture in the socket. In some embodiments the resistance 324 may be a fixed resistance, and may be a resistance which is substantially the same as the first resistance value of the variable resistance, e.g. the resistance 324 may be a 1 Mohm resistor. This would allow the output of comparator 322 to be used as an alternative or additional way of detecting the presence of a plug or moisture in the socket. In some embodiments however, as will be described in more detail below, the resistance 324 may also be a variable resistance.

A headphone detect (HPDET) circuit 328 is connected to the pads 310, 320 and 112, and can be used to perform an impedance measurement in some implementations as explained further below.

Figure 4:
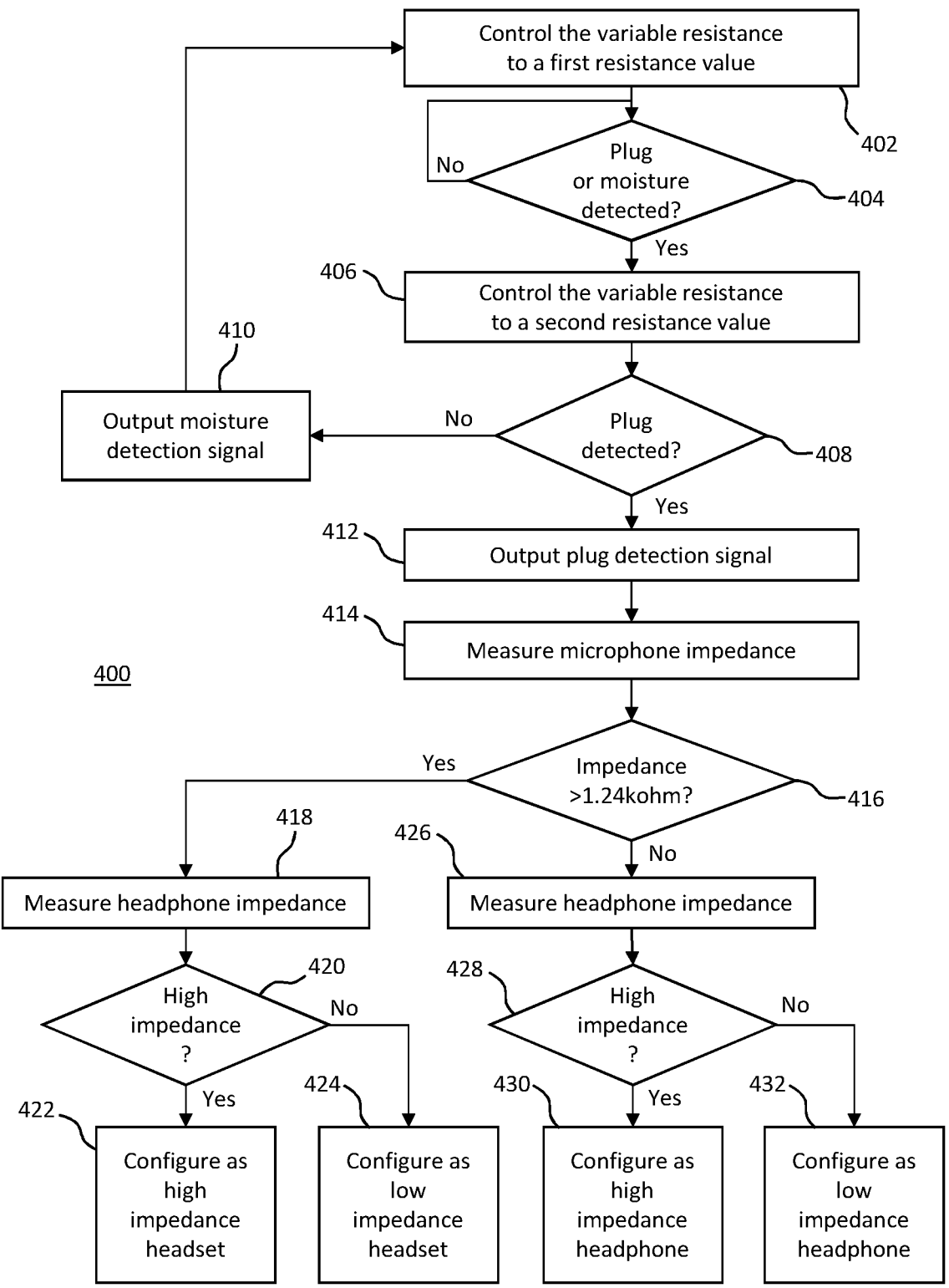
FIG. 4 illustrates a flow chart of an example operation of the circuit of FIG. 3.

FIG. 4 illustrates a flow chart of a method 400 of operation of the circuit 300, comprising a method of detecting insertion of a plug into the socket or a method of distinguishing between a plug and moisture in the socket. The method 400 starts at step 402, where the variable resistance 326 is controlled to a first resistance value between the power supply voltage Vdd and the node 118. The first resistance value may be 1 Mohm for example.

Next, in step 404, it is determined whether a plug or moisture is detected in the socket. For example, detection of a plug or moisture in the socket may comprise the output of either comparator 114 and 322 indicating that the voltage at the respective pad 112, 320 has been pulled to ground or near ground by the electrical connection caused by the plug or moisture. Where the output of comparator 114 is used, for example, the pad 310 may be driven to ground, such as by the HPDET circuit 328, such that pad 320 is at ground or near ground when a socket (or moisture) is present. Additionally or in alternative embodiments, the HPDET circuit 328 may perform a voltage measurement of pad 112 for example. The weak pull up due to the first resistance value ensures that either a plug or moisture in the socket will cause the pad 320 or 112 to be pulled to ground or near ground. In other embodiments, a plug or moisture in the socket may be detected based on the output of only one of the comparators 114 or 322.

If a plug or moisture is not detected in step 404, the method 400 may repeat step 404 (such as by polling the status of the output of the comparator 114 and/or 322) until a plug or moisture in the socket is detected, at which point the method advances to step 406. In this step, the variable resistance 326 is controlled to a second resistance value between the power supply voltage Vdd and the node 118. As a result of the second resistance value, the pull up of node 118 and pad 112 is stronger, such that moisture in the socket no longer pulls the voltage at node 118 to a level below the reference voltage Vref, whereas the presence of a plug in the socket is able to do so.

Following from step 406, at step 408 it is determined whether a plug is detected in the socket. As indicated above, this detection is unaffected by moisture. If a plug is not detected in the socket as indicated by the output of comparator 114, such as for example the voltage at the node 118 being pulled to or close to the power supply voltage Vdd, then it is assumed moisture is present in the socket. The method then proceeds to step 410, where in some embodiments a signal may be provided by the circuit 400 to indicate that moisture has been detected in the socket. The method may then return to step 402 in some embodiments.

If in step 408 a plug is detected in the socket, the method proceeds to step 412 where in some embodiments a plug detection signal is generated by the circuit 400. Next, in step 414, a measurement of impedance of a microphone potentially associated with the inserted plug is made. The device associated with the plug may be a headset, which includes left and right speakers, or headphones, which include left and right speakers but typically no microphone. A headphone may be connected to a TRS plug, in which case both the socket R2 connector and socket sleeve connector may contact the sleeve connector of the plug.

The impedance measurement may be made between, for example, pads 306 and 308 of the circuit 400, which are connected to the socket R2 connector and socket sleeve connector respectively. In the next step 416 of the method, it is determined if this impedance is greater than a threshold value, such as for example 1.25 kohm. If so, it is assumed that a microphone is present and a plug associated with a headset, not a headphone, has been inserted. In this case, in step 418 an impedance measurement of a speaker associated with the headset is made. This may be performed for example by the HPDET circuit 328 between pads 310 and 112, for example. Next, in step 420, it is determined whether the speaker impedance is a high impedance (such as 32 ohms for example), and if so, in step 422 it is assumed that the device connected to the circuit 400 via the inserted plug is a high impedance headset that includes a microphone. If instead it is determined in step 420 that a high impedance headset is not connected, then in step 424 it is assumed that a low impedance headset with microphone has been connected, that is, a headset with at least one 8 ohm speaker for example.

Returning to step 416, if it is determined that the measured microphone impedance is not greater than 1.25 kohm, it is assumed that a device has been connected that does not include a microphone. For example, the pads 306 and 308 may be connected to socket R2 and sleeve connectors respectively that contact the same sleeve pole of the inserted connector, and thus there is a very low impedance between the pads. Following step 416, therefore, in step 426 the headphone impedance is measured in a manner similar to step 420. Next, in step 428, it is determined if the measured impedance is a high impedance. If so, in step 430 it is assumed that a high impedance headphone is connected, otherwise in step 432 it is assumed that a low impedance headphone has been connected.

Figure 5A:
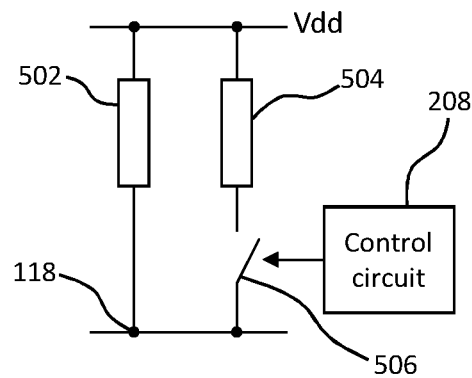
FIGS. 5A-B illustrate various examples of a variable resistance usable in embodiments.
Figure 5B:
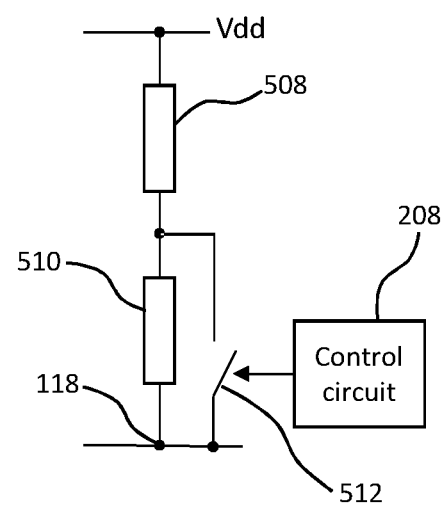

FIGS. 5A and 5B illustrate example implementations of variable resistances that could be used as variable resistance 116 shown in FIG. 1 and/or variable resistance 326 shown in FIG. 3. FIG. 5A, for example, shows a variable resistance that comprises a first resistor 502 connected between power supply voltage Vdd and node 118. A second resistor 504 and switch 506 are connected in series between Vdd and node 118. The switch is controlled to be open or closed by control circuit 208. In some embodiments, the resistor 502 is 1 Mohm and the resistor 504 is fixed at 5 kohm or is variable, such as between 2-10 kohm for example. In other embodiments, the resistances are chosen such that the resistance between Vdd and the node 118 is 1 Mohm when the switch is open, and 5 kohm or variable, such as between 2 kohm-10 kohm for example, when the switch is closed.

FIG. 5B shows another example in which a resistor 508 and resistor 510 are connected in series connected between Vdd and node 118. A switch 512 is connected in parallel with resistor 510 and controlled by control circuit 208. In some embodiments, the resistor 510 is 1 Mohm and the resistor 508 is fixed at 5 kohm or is variable, such as between 2-10 kohm for example. In other embodiments, the resistances are chosen such that the resistance between Vdd and the node 118 is 1 Mohm when the switch is open, and 5 kohm or variable, such as between 2 kohm-10 kohm for example, when the switch is closed.

In addition to the examples described above, there are many possible implementations of the variable resistance that may be used in embodiments disclosed herein.

In some embodiments the circuit for detecting the presence of an electrical plug or moisture in a socket may monitor more than one pole of the socket. For example as discussed above with respect to FIG. 3, two comparators 114 and 322 may be operable to monitor the voltages at pads 112 and 320 respectively so as to monitor two separate poles of the socket, in that example the poles that connect to second ring contact 108 and tip contact 104 respectively of plug 102. In some embodiments the circuit may be operable to be able to discriminate between connection of a plug and moisture in the socket at two more different poles of the socket.

Figure 6:
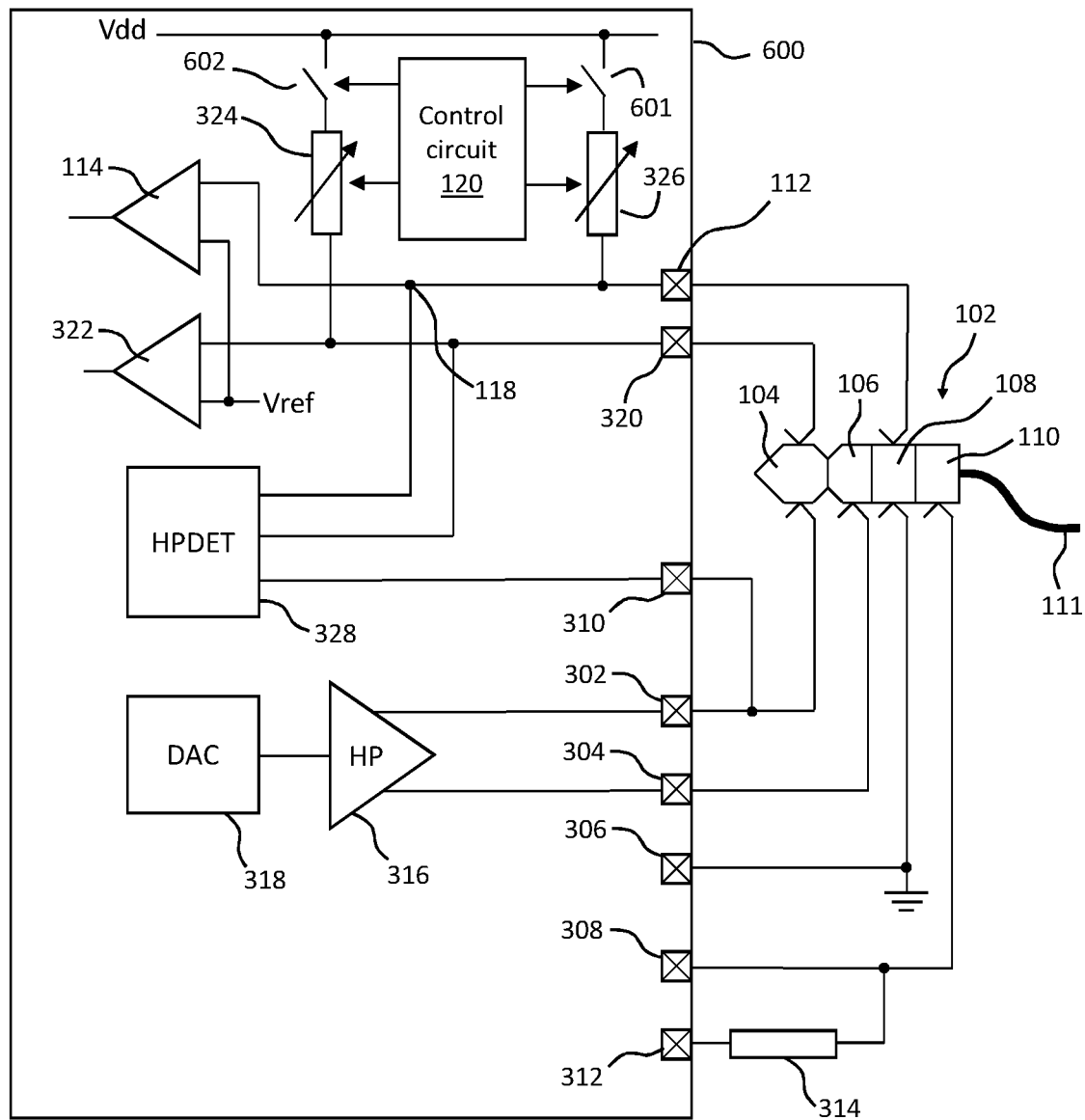
FIG. 6 illustrates another embodiment of a circuit that may be used to distinguish between a plug and moisture within a socket.

FIG. 6 illustrates a further embodiment of a circuit for detecting the presence of an electrical plug or moisture in a socket. FIG. 6 illustrates a circuit 600 which is similar to that described above with respect to FIG. 3 in which similar components have been labelled using the same reference numerals.

In the embodiment illustrated in FIG. 6 variable resistance 326 is coupled between a defined voltage Vdd and a pad 112 connected, in use, to a pole of the socket to be monitored, i.e. a socket connector or contact. In use the resistance value of variable resistance 326 may be controlled by control circuit 120 and may be selectively variable between at least first and second resistance values in a similar manner as discussed above with respect to method 200. The output of comparator 114 may thus be monitored with the variable resistance 326 set to a first resistance value to detect that something is present in the socket, e.g. a plug or moisture, and then the variable resistance 326 may be controlled to a second, lower, resistance value to allow discrimination between a plug and moisture.

In the embodiment of FIG. 6 the resistance 324 is also a variable resistance. The value of resistance of variable resistance 324 may also be selectively controlled by the control circuit 120. In some implementations the variable resistance 324 may be selectively variable between at least first and second resistance values which may be the same resistance values as for variable resistance 326. This arrangement means that the output of comparator 322 can also be used to detect the presence of a plug or moisture in the socket and means that the presence of moisture can be discriminated from the presence of a plug. This allows the presence of moisture to be independently detected at different parts of a socket.

It will be appreciated that moisture in the socket may, in some instances, not be present throughout the whole of the socket. A bead or drop of moisture within a socket may be small enough to contact only some of the contacts of a socket, such as a conventional 3.5 mm jack-socket. As such, it may be possible that there could be moisture within the socket, but the moisture may not detectable at a given pole of the socket. For example moisture may be present at part of the socket for receiving the tip of the plug, but there may be no or limited moisture at the part of the socket corresponding to the second ring contact (or vice versa).

Moisture present in a part of the socket that is not being used for jack-plug detection (to determine the presence or absence of a plug) may not interfere with reliable detection of the presence of a plug and thus could, in some implementations, be ignored. In some instances however it may be desirable to determine if there is moisture in the socket even if the moisture does not interfere with plug detection. To provide such moisture detection it may therefore be desirable to provide the ability to detect the presence of moisture at different parts of the socket. Additionally or alternatively it may be desirable to perform jack-plug detection at different parts of the socket, as illustrated in FIG. 3, and it may be desirable to be able to discriminate between a plug and moisture at each monitored part of the socket.

In embodiment illustrated in FIG. 6 the variable resistance 326 and comparator 114 are operable to provide jack-detection and allow discrimination between a plug and moisture at a part of the socket corresponding to the second ring contact. Variable resistance 324 and comparator 322 are additionally operable to provide jack-detection and allow discrimination between a plug and moisture at a part of the socket corresponding to the tip contact.

It will be appreciated that circuit 600 illustrates the monitored pads 112 and 320 being coupled to contacts 108 and 104 merely for illustrative purposes and circuit 600 could be configured to additionally or alternatively provide monitoring at any of the other contacts.

As also noted above in some instances it may be desirable to monitor a given contact of the socket on a periodic, rather than a continuous basis. In the embodiment illustrated in FIG. 6 the control circuit 120 may therefore be operable such that the voltage pull-up provided by supply voltage Vdd and variable resistance 326 or 324 may be pulsed on and off. In the example of FIG. 6 switches 601 and 602 are thus connected in series with variable resistances 326 and 324 respectively so as to enable or disable the circuit path between the defined voltage Vdd and the relevant pad 112 or 320 respectively.

In some embodiments to provide monitoring for the presence of a plug, switch 601 may be closed with variable resistance 326 controlled to have the first resistance value and the output of comparator 114 monitored. If the output of comparator 114 changes state to indicate that something is present in the socket, the value of the variable resistance may be changed to a second, lower, value to allow discrimination between a plug and moisture. If moisture is detected then a moisture flag may be set. To provide ongoing detection for whether a plug is subsequently inserted (and/or whether moisture is present) the variable resistance may be maintained at the second, lower value, however in this case the voltage pull-up provided by the variable resistance 326 may be activated only periodically. Thus switch 601 may be closed periodically for a defined interval to allow the output of comparator to indicate whether or not there is a plug or moisture in the socket, or whether there is no longer anything in the socket. The interval between successive tests of the socket may be chosen so that, if a plug is subsequently inserted, it can be detected within a timescale that would be acceptable to a user. The duration of each "test" may be selectable to provide sufficient time for the voltage at the input of comparator 114 to stabilise to provide a reliable detection. If, during a subsequent test period, the comparator indicates that nothing is present in the socket the moisture flag may be cleared. If a subsequent test indicates that a plug is present, a jack detect flag may be set. In such a case the detection circuit may continue periodic testing to determine whether the plug is still present or whether it has been removed. Where a moisture flag was previously set, the testing may be performed using a lower value of variable resistance so as to detect when the plug has been removed but moisture still remains. In some instances in the event that a plug is detected without there having been a moisture flag set, the detection circuit may perform periodic detection and may use a relatively low resistance for the variable resistance as moisture may have been introduced with the plug and may remain after the plug is removed.

Controlling the pull-up voltage to be active periodically avoids a constant current flow in the case where there is moisture or a plug present in the socket which would have an adverse impact on power consumption. In addition current flow via moisture in the socket could cause issues with oxidation. In embodiments of the present disclosure the voltage pull-up may not be continually applied, thus avoiding constant current flow.

A similar approach can be used when operating at the higher resistance value, e.g. the first resistance value. However it will be understood from the discussion above that the high resistance value may be used until something is detected in the socket and thus is generally used in the absence of anything in the socket. Thus current flow may be less of a concern and the higher resistance value will generally result in a smaller current.

The variable resistance 324 may be controlled in generally the same way, with control circuit 120 controlling activation of the voltage pull-up applied to pad 320 via switch 602. In some instances the switches 601 and 602 could be controlled to be switched in synchronism with each other, however in some embodiments the switches 601 and 602 may be controlled in a time-division type way so that switch 601 is on for at least part of the period when switch 602 is off and vice versa, i.e. to alternate between activating the voltage pull-up of pads 112 and 320.

Embodiments thus provide circuitry for monitoring a socket to detect when a plug has been inserted that do not require the activation of a mechanical switch and can detect the presence of a plug through a resultant electrical connection of two socket contacts. Embodiments can also discriminate between a plug and a 'false' connection due to moisture or the like in the socket. In some embodiments the socket which is monitored may be a socket of a host device, e.g. such as a smartphone or tablet computer or the like.

Figure 7:
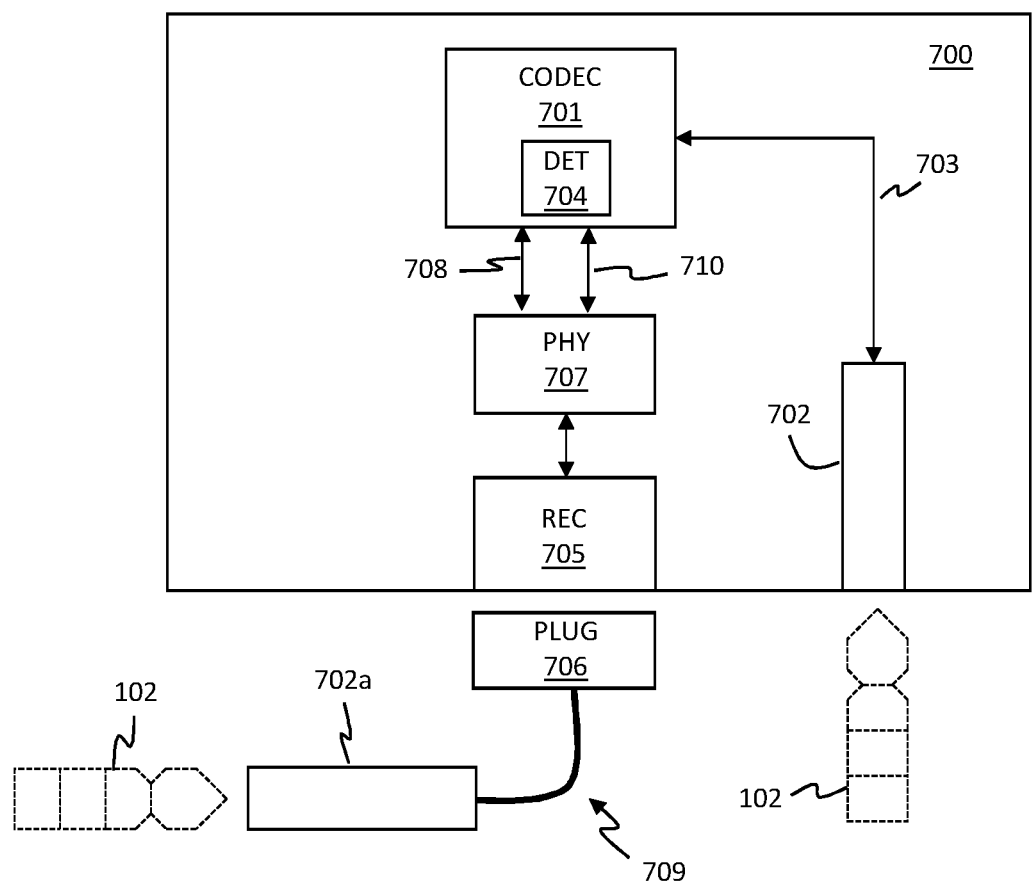
FIG. 7 illustrates a device according to an embodiment.

FIG. 7 illustrates an electronic device 700 which may be any type of electronic device which may be operable with an audio accessory apparatus to output audio to the audio accessory apparatus signals, e.g. for playback, and/or receive audio signals from the audio accessory apparatus, e.g. a microphone signal. The device may therefore comprise an audio circuit, such as a codec 701, capable of input and output of analogue audio signals.

In some implementations the device 700 may have a socket 702, such as a conventional 3.5 mm audio socket for input/output of analogue audio signals. The socket 702 may for instance be four-pole socket TRRS socket such as described above. The codec 701 may be coupled to the socket 702 via suitable signal paths 703. A detection circuit 704, which may be a detection circuit such as described above with reference to any of FIG. 1, 3 or 6, is also coupled to the socket 702 and operable to detect the presence of a plug or moisture within the socket as discussed above. In this example the detection circuit forms at least part of codec 701.

In some instances however the socket monitored by the detection circuit may be a socket of an external accessory apparatus, such as an adapter apparatus, which may be connected to the device via some removable connector suitable for general data transfer and operable for digital data transfer.

Many electronic devices may include a connection interface suitable for digital data transfer, for instance a USB connector (e.g. a micro USB or USB-C connector for example) or a Lightening connector. Thus the device 700 may comprise a general purpose connector, for example a USB-C compliant receptacle 705, for receiving a mating connector 706 of an accessory apparatus.

Data transfer via the general purpose connector, i.e. receptacle 705, may be controlled by a physical layer controller PHY 707. PHY 707 may monitor the status of receptacle 705 to determine a connection status and also, when insertion of a suitable plug is detected, to determine the type of accessory connected. In some embodiments the codec 701 may be able to input and output digital audio data via the general purpose connector, i.e. receptacle 705, via suitable digital data paths 708.

In some instances, especially in cases where the device 700 does not have its own dedicated audio socket, i.e. there is no 3.5 mm jack-socket for analogue audio, it may be possible to transfer analogue audio to and from an accessory apparatus connected via the general purpose connector, i.e. receptacle 705. For instance the USB Type-C Specification defines an Audio Adapter Accessory Mode. In this mode defined pins of the USB Type-C connector are used for analogue left and right audio signals, a microphone bias/input path and ground, i.e. the conventional connections for a TRRS analogue connector. This makes it possible to use legacy analogue accessory apparatus, such as legacy headsets having a 3.5 mm jack plug, by using a 3.5 mm jack to USB Type-C adapter.

FIG. 7 also illustrates an example of an adapter apparatus 709. The adapter 709 has a plug 706, e.g. a USB-C compliant plug, for mating with the receptacle 705 of device 700. Connected to plug 706 via suitable signals paths is a socket 702a, which may be a conventional 3.5 mm three- or four-pole socket, for instance a TRRS socket suitable for receiving a TRRS plug 102.

In use the general purpose connector of the adapter, e.g. USB-C compliant plug 706, may removably connected to the receptacle 705 of device 700. The PHY 707, which is monitoring receptacle 705, will detect insertion of plug 706. PHY 707 will also detect, for example from the values of certain defined resistances coupled to defined pins when the plug is mated, that the connected accessory is one for which analogue audio transfer is required. Thus for a USB-C connector the PHY 707 will configure the receptacle, e.g. USB receptacle 705, for example to operate in the Analogue Adapter Accessory mode in accordance with Annex A of the USB type-C specification, and signal paths 710 for analogue audio will be established between the codec 701 and external socket 702a. The host device 700 will then be able to transfer analogue audio signals from/to an analogue audio accessory device which is connected to the external socket 702a.

In use the PHY 707 monitors the receptacle 705 for presence of a mating plug 706. The PHY 707 may also be configured to determine if there is moisture in the receptacle 705. However when an adapter apparatus 709 is connected, the PHY 707 will determine that a suitable plug is inserted and configure the interface of the receptacle 705 accordingly. There may however still be a desire to determine whether or not there is a plug present in the external socket 702*a* or whether there is moisture in the external socket.

In some embodiments the external socket 702*a* may have contacts located in the socket that are arranged to contact the same pole of a plug when fully inserted in a similar manner as discussed above, i.e. the external socket could be arranged with two contacts that will be shorted together by one of the poles of the plug when inserted. In such embodiments the PHY 707 may be arranged such that signal paths 710 used in an analogue mode include at least one jack-detect path, e.g. referring back to FIG. 3 the analogue signal paths 710 could include a path from pad 320 of detection circuit 704 to a tip contact of the external socket 702*a*, as well as the normal audio path to the tip contact. In this case the detection circuit 704 of the codec 701, can monitor the external socket in the same way as discussed above for a socket of the host device itself and can distinguish between the presence of moisture or a plug in the external socket 702*a* of the adapter apparatus 709. In some implementations the adapter apparatus 709 may comprise one suitable contact for jack-detection but in some embodiments the external socket 702*a* of adapter apparatus 709 could be adapted to provide jack/moisture detection at more than one location of the external socket 702*a*, and the PHY 707 could be configured to establish multiple jack detect paths to the detection circuit 704.

Some embodiments described above may be implemented for example by an integrated circuit (IC), which may comprise pads for connection to external components such as resistors, socket connectors, one or more power supply voltages, and/or other components. The IC may be packaged within a chip package whereby the pads, terminals or nodes are connected to external pins of the chip package, and the pins may be connected to external components. Any of the components described in the example embodiments above may be implemented as external to the IC or the chip package, or may instead be integrated onto the IC ("on-chip") or within the chip package where appropriate.

In the above examples, a power supply voltage Vdd and ground are given as being connected to particular nodes. However, in some embodiments these may be interchanged or replaced by other voltages, such as first and second voltages. Additionally or alternatively, where a component is indicated to be connected between two nodes, this is intended to indicate that the component is connected directly between these nodes, or alternatively in series with other circuit components.

The skilled person will recognise that at least some aspects of the above-described apparatus and methods may be embodied as processor control code, for example on a non-transitory storage or carrier medium such as a disk, CD- or DVD-ROM, programmed memory such as read only memory (Firmware), or on a data carrier such as an optical or electrical signal carrier. For some applications, embodiments will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments are illustrative rather than limiting embodiments, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

What is claimed is:

1. A circuit comprising:
   a first node arranged to be electrically connected to a first pole of an electrical plug when the electrical plug is inserted into a corresponding socket;
   a second node arranged to be connected to a first voltage, wherein the second node is arranged to be connected to the first pole when the electrical plug is inserted into the socket;
   a variable resistance connected between the first node and a third node, wherein the third node is arranged to receive a second voltage;
   a detection circuit arranged to detect the presence of the electrical plug or moisture in the socket based on a voltage at the first node; and
   a control circuit arranged to control the variable resistance to a first resistance value and, in response to the detection circuit detecting the presence of the electrical plug or moisture in the socket when the variable resistance is at the first resistance value, to a second resistance value, whereby the detection circuit distinguishes between the electrical plug and moisture within the socket;
   wherein the control circuit is arranged, in response to the detection circuit detecting the presence of moisture in the socket, to periodically test for the presence of the plug by repeatedly and periodically controlling the variable resistance to the second resistance value with the second voltage applied to the third node.

2. The circuit of claim 1, wherein the first voltage is a first power supply voltage, and the second voltage is a second power supply voltage.

3. The circuit of claim 1, wherein the detection circuit is arranged to detect whether the voltage at the first node is at a level between the first voltage and a first reference voltage.

4. The circuit of claim 1, wherein the detection circuit comprises a comparator arranged to compare the voltage at the first node with the first reference voltage;
   wherein the comparator is arranged to output a first value indicating that the voltage at the first node is between the first voltage and the first reference voltage, and a second value indicating that the voltage at the first node is between the second voltage and the first reference voltage.

5. The circuit of claim 1, wherein the variable resistance comprises a first resistor connected between the first node and the third node, and a second resistor and a switch connected in series between the first node and the third node, wherein the second resistor is one of a fixed resistor and a variable resistor.

6. The circuit of claim 1, wherein the variable resistance comprises a first resistor connected between the first node and the third node, and a second resistor connected between the first node and the third node, wherein the second resistor is a variable resistor.

7. The circuit of claim 1, wherein the variable resistance comprises a first resistor and a second resistor connected in series between the first node and the third node, and a switch connected in parallel with the first resistor or the second resistor.

8. The circuit of claim 1, wherein the control circuit is arranged, when the detection circuit detects the presence of the electrical plug in the socket but does not detect the presence of moisture in the socket, to control the variable resistance to the first resistance value.

9. The circuit of claim 1, wherein the first resistance value is greater than the second resistance value.

10. The circuit of claim 1, wherein the resistance value is 1 Mohm and the second resistance value is 2 kohm-10 kohm.

11. The circuit of claim 1, wherein the first resistance value is at least 100× the second resistance value.

12. The circuit of claim 1, wherein the control circuit is arranged to generate a first output signal on detection of the electrical plug or moisture in the socket by the detection circuit, and a second output signal on detection of the electrical plug but not moisture in the socket.

13. The circuit of claim 12, wherein the first and second signals are interrupt signals.

14. The circuit of claim 1, wherein the first pole is a second ring (R2) connector of a 2.5 mm or 3.5 mm jack plug.

15. A device comprising a socket for an electrical plug and a circuit as claimed in claim 1, wherein the socket comprises a first connector connected to the first node and a second connector connected to the second node and the first voltage.

16. The device of claim 15, wherein the device is one of a laptop computer, desktop computer, tablet computer and mobile telephone.

17. A circuit comprising:
a first connector arranged to contact a first pole of an electrical plug when the electrical plug is inserted into a corresponding socket, wherein the first connector is connected to a first power supply voltage;
a second connector connected to a first node and arranged to contact the first pole of the electrical plug when the electrical plug is inserted into the socket;
a variable resistance connected between the first node and a second power supply voltage;
a detection circuit arranged to detect the presence of the electrical plug or moisture in the socket based on a voltage at the first node; and
a control circuit arranged to control the variable resistance to a first resistance value and, in response to the detection circuit detecting the presence of the electrical plug or moisture in the socket, to a second resistance value, whereby the detection circuit distinguishes between the presence of the electrical plug in the socket and the presence of moisture in the socket; and
wherein in response to the detection circuit indicating the presence of moisture in the socket, the control circuit is configured control the variable resistance to the second resistance value with the second power supply voltage active at periodic intervals.

18. A detection circuit for detecting a plug in a socket, the circuit comprising a variable resistance between a first node and a first voltage, the circuit arranged to control the variable resistance between at least a first value and a second lower value to distinguish between the plug and moisture in the socket, wherein the detection circuit is configured to, when moisture is detected in the socket, operate at intervals with the variable resistance at the second value and the first voltage active to provide monitoring for the presence of the plug in the socket and, between said intervals to operate with the variable voltage at the first value and/or with the first voltage disabled.

19. The detection circuit of claim 18, wherein the first node is arranged to be electrically connected to a second voltage when the plug is inserted into the socket.

* * * * *

UNITED STATES PATENT AND TRADEMARK OFFICE
CERTIFICATE OF CORRECTION

| | | |
|---|---|---|
| PATENT NO. | : 10,782,361 B2 | |
| APPLICATION NO. | : 15/906354 | |
| DATED | : September 22, 2020 | |
| INVENTOR(S) | : Taylor et al. | |

It is certified that error appears in the above-identified patent and that said Letters Patent is hereby corrected as shown below:

In the Claims

1. In Column 16, Lines 41-42, in Claim 1, delete "of the plug by" and insert -- of the electrical plug in the socket by --, therefor.

2. In Column 17, Line 16, in Claim 10, delete "the resistance value" and insert -- the first resistance value --, therefor.

3. In Column 18, Line 21, in Claim 17, delete "configured control" and insert -- configured to control --, therefor.

Signed and Sealed this
Twenty-fourth Day of October, 2023

Katherine Kelly Vidal
*Director of the United States Patent and Trademark Office*